United States Patent
Melcher et al.

(10) Patent No.: US 6,400,163 B1
(45) Date of Patent: Jun. 4, 2002

(54) CIRCUIT ARRANGEMENT FOR MONITORING AN ELECTRONIC SWITCH CONTROLLING A LOAD

(76) Inventors: Rolf Melcher, Sonneneck 5, 51645 Gummersbach; Siegfried Seliger, Lange Fuhr 110, 44149 Dortmund, both of (DE)

( * ) Notice: Subject to any disclaimer, the term of this patent is extended or adjusted under 35 U.S.C. 154(b) by 76 days.

(21) Appl. No.: 09/657,409

(22) Filed: Sep. 8, 2000

(30) Foreign Application Priority Data

Sep. 8, 1999 (DE) .......................................... 199 42 830
Dec. 28, 1999 (DE) .......................................... 199 63 384

(51) Int. Cl.[7] .......................... G01R 27/08; H01H 51/22; H01H 47/26
(52) U.S. Cl. .......................... 324/713; 324/126; 324/715; 361/160; 361/101
(58) Field of Search .......................... 324/713, 126, 324/715; 361/160, 101

(56) References Cited

U.S. PATENT DOCUMENTS

| 4,820,968 | A |   | 4/1989  | Wrathall        | 323/316 |
| 4,896,245 | A | * | 1/1990  | Qualich         | 61/103  |
| 4,945,445 | A |   | 7/1990  | Schmerda et al. | 361/101 |
| 4,967,309 | A |   | 10/1990 | Hoffman         | 361/160 |
| 5,119,265 | A | * | 6/1992  | Qualich et al.  | 361/103 |
| 5,541,806 | A | * | 7/1996  | Hoffman         | 361/160 |
| 5,804,979 | A |   | 9/1998  | Lund et al.     | 327/233 |
| 5,920,452 | A | * | 7/1999  | Sullivan        | 361/101 |

FOREIGN PATENT DOCUMENTS

| DE | A1-19704861 | 8/1998 |
| DE | A1-19736752 | 2/1999 |
| DE | A1-19743346 | 4/1999 |
| WO | A1-9810301  | 3/1998 |

\* cited by examiner

*Primary Examiner*—N. Le
*Assistant Examiner*—Wasseem H. Hamdan

(57) ABSTRACT

In a circuit arrangement for monitoring an electronic switch provided for controlling a load and current flown through the load during turn-on intervals for driving the load, the switch has a substantially linear resistance behavior during parts of its turn-on state and the operating point of the switch is located in this part of the turn-on state during the load control. The circuit arrangement comprises a modulation signal generator for generating a modulation signal for modulating the load current flowing through the electronic switch. A first voltage measuring device measures the first voltage drop across the electronic switch caused by the modulation signal. A second voltage measuring device measures the voltage drop across the electronic switch caused by the load current, and an evaluation unit determines the load current from the modulation signal and the first and second voltage drops.

18 Claims, 7 Drawing Sheets

CIRCUIT ARRANGEMENT FOR MONITORING AN ELECTRONIC SWITCH CONTROLLING A LOAD

BACKGROUND OF THE INVENTION

1. Field of the Invention

The present invention relates to a monitoring and current measuring unit for MOSFET transistors in low side (LS) and/or high side (HS) configuration, with any electrical load, in particular, an inductive load. The invention is aimed at a precise detection of a current through a transistor and at the detection of faulty conditions by only observing the voltage curve of the drain-to-source voltage of a HS and a LS transistor for driving a load.

2. Description of Related Art

Conventionally, to realize the functionality described, a measuring method is frequently used for load drives with discrete power MOSFETs, such a method is based on measuring current across a shunt resistor in the load current circuit (see, e.g., U.S. Pat. No. 4,967,309 and U.S. Pat. No. 4,820, 968). At present, these discrete power MOSFETs are driven by ICs based on high voltage BCD and CMOS process technologies. With high load currents, it is not economic to integrate the shunt resistor into the drive element. Therefore, power MOSFETs are used that have a sense current output through, which a part of the load current is coupled. Then, the shunt resistor may be integrated into the drive element, thus saving external components. This advantage comes at the price of needing a greater functional effort for the discrete power MOSFETs. With fully integrated LS/HS switch configurations based on junction-insulated BCD or CMOS process technologies, this greater effort is negligible. However, a drawback to the above is that the power MOSFETs are produced in a rather complex process technology when compared with discrete transistors so that this solution is no longer economical above a certain current value. Thus, current measuring, e.g. in a motor bridge circuit comprising discrete power MOSFETs without shunt resistors, based on the voltage drop across the drain-to-source path, is desirable. Since the turn-on resistance of a transistor is subject to a relatively large variance in components, temperature dependence, and degradation with age, this measure is very inexact so that it is insufficient for a control and monitoring of a motor bridge circuit, for example. Calibration methods based on calibration curves of the turn-on resistance as a function of the temperature are elaborate and costly.

In German Patent 197 43 346, a circuit arrangement for clocked current control of inductive loads is known, wherein a free-wheeling diode with a current measuring means is connected in parallel with the load. In this circuit arrangement, no shunt resistor is needed since current measuring is effected exclusively during the OFF state of the switch controlling the load.

Finally, in German Patent 197 36 752, another circuit arrangement is known for protecting a drive circuit, wherein the voltage drop across a driving field effect transistor is measured and evaluated by a microprocessor. In this circuit arrangement, the determination of the load current requires knowledge of the internal resistance of the field effect transistor. However, this internal resistance is not constant over the operating area of the field effect transistor, which is why measuring with the known circuit arrangement is rather inaccurate and established protection of the driving circuit is very limited.

In WO-A-98/10301, the current in the transistor is measured by observing the voltage drop induced by the load current across the transistor. The temperature of the transistor is measured by observing the junction voltage of a diode that is biased with a test current source and thermally connected to the transistor. This temperature indicating diode voltage is translated into a predicted transistor on-resistance. By dividing the measured voltage drop across the transistor by the predicted on-resistance, the magnitude of current provided to the load is determined. The current measurement requires a calibration measurement of the on-resistance at a known temperature. This leads to additional effort and if it is done only once in the production line device, degradation will not be taken into account. Having a diode that must be thermally coupled to the transistor increases the production cost.

In DE-A-197 04 861 A1, circuitry and method for controlling and observing semiconductors switches is described. Like in WO-A-98/10301, the drain source voltage drop induced by the load current is observed. The temperature is measured with bipolar transistor thermally connected to the MOSFET carrying the load current. The maximum drain-source voltage is determined by taking into account the thermal resistance between junction and the temperature at the measurement point. Like in WO-A-98/10301, the temperature measuring device and the calibration of the MOSFET on-resistance increases the production cost. In the present invention, the temperature is measured directly at the junction carrying the load current. This is more safer, more precise and less expensive as compared to measuring the diode forward voltage of a device which is only indirectly thermally coupled, like in the PCT mentioned above.

In U.S. Pat. No. 4,945,445, the current in the semiconductor switch is measured as a voltage drop across the bond wire with two additional current sense pads connected by a conductor jumper bond wire. The current sense circuitry observes the voltage drop across the current sense pads and amplifies this voltage.

A comparator compares the amplified voltage against a reference voltage and generates an output signal when the threshold is exceeded. A second comparator compares the thermistor voltage against a reference voltage and generates an output signal when the temperature exceeds the threshold. Both output signals are used to disable the gate drive of the MOSFET. This solution needs a special five terminal MOSFET module housing and a thermistor element for the temperature measurement. Due to the non-standard module housing and the thermistor element this solution is more expensive than the solution in the present invention. The calibration of the bond wire resistance requires additional effort.

In U.S. Pat. No. 5,804,979, a circuit for measuring alternating and direct current without breaking the conductor is provided. A modulated current source is used to couple a test current across the segment of the conductor. A synchronous demodulator which is also coupled in parallel with the segment separates the voltage drop due to the modulated test current from the current in the conductor. By measuring the test voltage drop and the voltage drop and combining this with the test current, the resistance of the segment and the current in the segment can be calculated. The described measurement principle is applied to an linear resistance connected to a current source. The requirements for monitoring and controlling a semiconductor switch and its different load conditions are not dealt with. Furthermore thermal effects are not considered.

SUMMARY OF THE INVENTION

In a circuit arrangement for monitoring an electronic switch provided for controlling a load and load current flown through the load during turn-on intervals for driving the load, the switch has a substantially linear resistance behavior during parts of its turn-on state and the operating point of the switch is located in this part of the turn-on state during the load control. The circuit arrangement comprises a modulation signal generator for generating a modulation signal for modulating the load current flowing through the electronic switch, a first voltage measuring device for measuring the first voltage drop across the electronic switch caused by the modulation signal, a second voltage measuring device for measuring the voltage drop across the electronic switch caused by the load current, and an evaluation unit for determining the load current from the modulation signal and the first and second voltage drops.

The invention to be described could find application, for example, in a coil driver of an electromagnetic valve. In this case, the coil driver may be designed as a LS switch and/or a HS switch. Other possible applications are a MOSFET bridge circuit for driving pulsed DC motors, stepper motors, or asynchronous motors. A precise detection of the current-voltage curve is necessary for current control and for fault diagnosis. Using, for example, an integrated circuit (ASIC) for driving a half-/full-bridge circuit formed of external power semiconductors of the field effect transistor type, the above described arrangement can monitor occurring load current peaks and the internal heating-up of the power switches by exactly determining the RDS on-resistance and the switch voltage.

It is an objective of the present invention to provide a circuit arrangement for monitoring and controlling, i.e. supervising, an electronic switch that controls a load and through which a load current flows for driving the load, wherein the circuit arrangement can easily be connected to the terminals of a standard switch, a 3 terminal MOSFET, for example. No modifications of said electronic switch are required and the switch is operable without using a shunt resistor or any additional temperature measuring devices.

According to the present invention, the objective is solved with a circuit arrangement for monitoring an electronic switch provided for controlling a load and a current flown through the load during turn-on intervals and for driving the load. The switch has a substantially linear resistance behavior during parts of its turn-on state and the operating point of the switch is located in this part of the turn-on state during the load control. The circuit arrangement having a modulation signal generator for generating a modulation signal modulating the load current flowing through the electronic switch, a first voltage measuring device for measuring the first voltage drop across the electronic switch caused by the modulation signal, a second voltage measuring device for measuring the voltage drop across the electronic switch caused by the load current, and an evaluation unit determining the load current from the modulation signal and the first and second voltage drops.

The present invention starts from a low side/high side (LS/HS) switch configuration consisting of power MOSFETs with an inductive load, for example, and is directed to the realization of a circuit for load current measuring based on the drain-to-source voltage of the MOSFET switches. Of importance for the invention is the reduction of the current measured to a determination of the differential turn-on resistance of the active LS/HS transistors. The differential resistance of the turned-on transistor can be determined by measuring the change in the drain-to-source voltage caused by a known change of the current flowing through the switch (current modulation). When the transistor is in an approximately linear operating region, i.e. the difference between the gate-to-source voltage and the threshold voltage is larger than the drain-to-source voltage, the differential turn-on resistance and the absolute value of the turn-on resistance are identical. Thus, the unknown load current can be determined from the absolute value of the drain-to-source voltage and the differential turn-on resistance.

According to the invention, it is not imperative to determine the differential turn-on resistance separately. In determining the load current, the differential turn-on voltage merely serves as an intermediate value that does not necessarily have to be supplied by the evaluation unit as a value. The evaluation unit employs Ohm's law to derive the (momentary) value of the load current from the modulation signal and the first and second voltage drops.

As far as supervisory purposes are concerned, the knowledge of the actual turn-on resistance of the electronic switch can be determined by the evaluation unit from the modulation signal and the first voltage drop, i.e. from the voltage drop across the turn-on resistance caused by the modulation of the load current.

Using prior calibration data of the electronic switch, the temperature variation of the switch can be determined as a function of the change in the turn-on resistance. By determining the turn-on resistance, the actual temperature of the electronic switch may be derived in the evaluation unit.

Generally, the electronic switch will be a field effect transistor, in particular a MOSFET.

The modulation signal, which, in particular, is a measuring current supplied into the connecting line between the electronic switch and the load and/or "drawn" from this node, flows dependently on the ratio of the impedances of the load and the electronic switch across these two components. If the impedance (ON resistance) of the electronic switch in the operating point is negligible compared to the impedance of the load, the portion of the measuring current flowing off over the load may be neglected in the determination by the evaluation unit. For reasons of simplicity, the evaluation unit uses the measuring current generated by the measuring current source. This measuring current is known per se and can be obtained from the driving signal of the modulation signal generator, for example, which, in the present case, is a current source.

If, however, the impedance of the electronic switch is not negligible with respect to the impedance of the load, the portion of the measuring current flowing off over the electronic switch can be determined when the impedance of the load is known so that, in the evaluation unit, this portion of the measuring current passing the electronic switch is included in the calculation. As described above, the present device can be used to determine, during a turn-on interval, the electric current flowing through the closed electronic switch and also through the load itself. With the electronic switch turned off, the connection between the load and the operating voltage source is interrupted.

If, in this case, a modulation signal is generated, a current eventually flows through the load referenced above as the measuring current. With the switch opened, this measuring current flows through the load. Should the load impedance be unknown, but be substantially linear and, in particular, constant, the measuring current and the first voltage drop can be used to determine the momentaneous impedance of the load. If the supply voltage is known, it is included in the determination of the impedance. This supply or operating voltage may also be obtained during those intervals in which no current, due to the modulation signal, flows through the load, by measuring the second voltage drop. By this determination of the impedance of the load, a higher measuring accuracy of the present circuit arrangement can be achieved, specifically by making use of the impedance of the load, determined in the OFF state of the switch, in the subsequent determination of the load current with the switch closed.

BRIEF DESCRIPTION OF THE DRAWINGS

The following is a detailed description of the invention with reference to the accompanying figures, wherein.

DETAILED DESCRIPTION OF PREFERRED EMBODIMENTS

Figure 1:
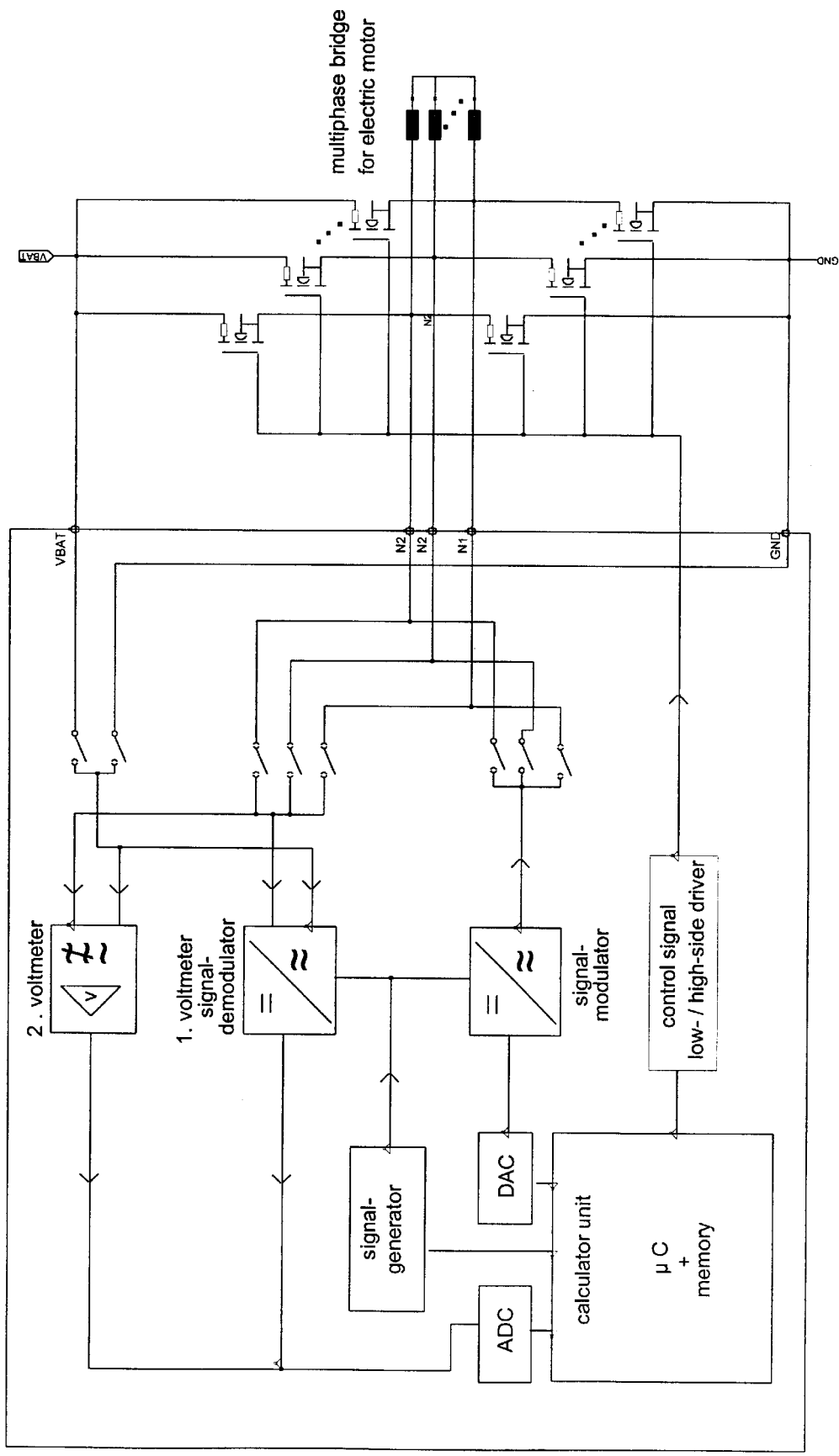
FIGS. 1 and 2 illustrate embodiments of the invented circuit arrangement implemented for monitoring the high and low side switches of a motor bridge control circuit.
Figure 2:
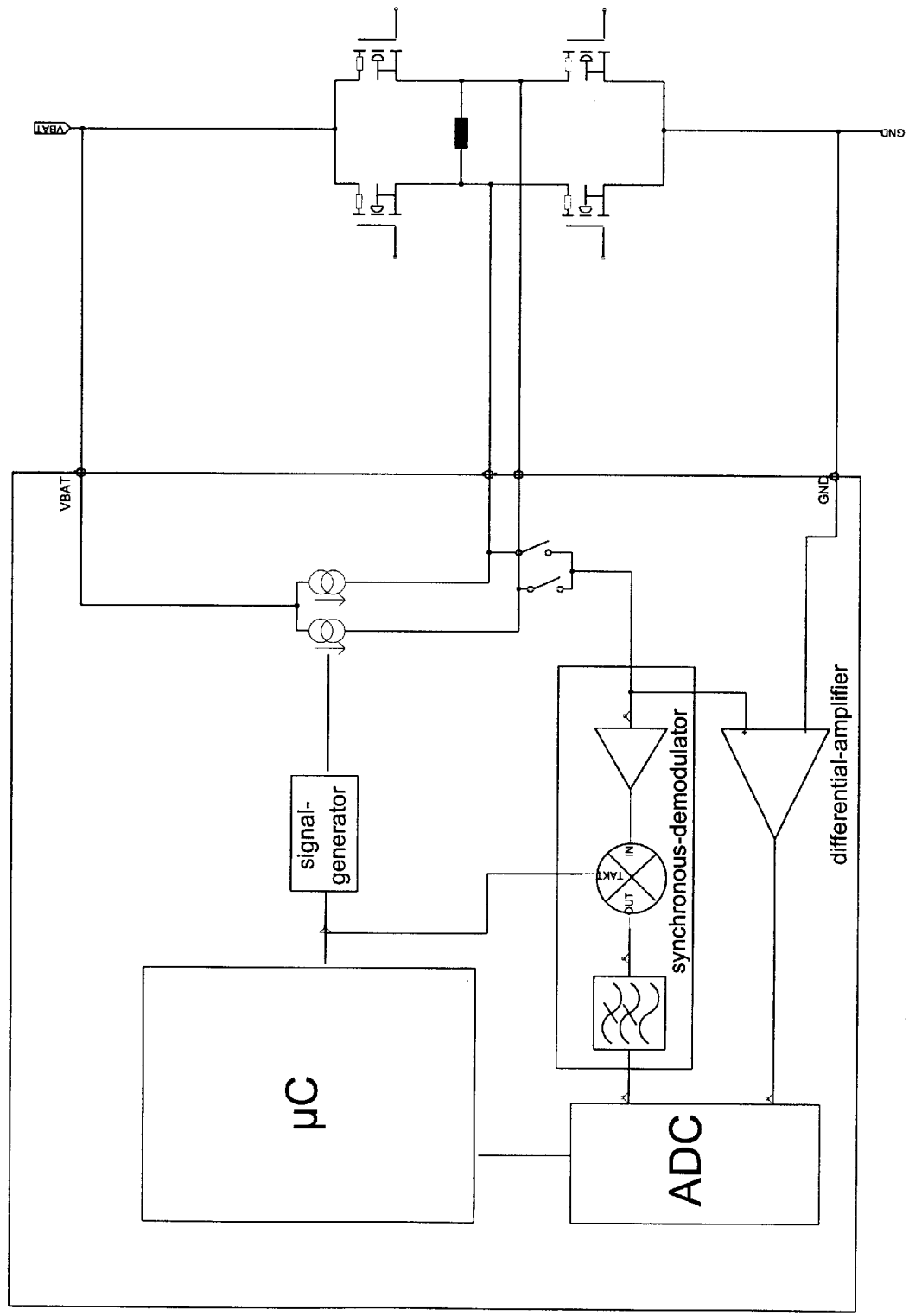

Referring now to FIGS. 1 and 2, an exemplary embodiment of the present invention comprises a current modulator and a synchronous voltage modulation for realizing the functions according to the invention. As illustrated in FIGS. 1 and 2, the measuring current having the amplitude $I_{REF}$ and the frequency ω is supplied into the central tap between the transistor and the inductor. The change in voltage caused by the measuring current across the drain-to-source path of the turned-on transistor is detected by a synchronous demodulator. The voltage amplitude $U_d$ thus obtained, together with the amplitude of the injected reference current ($I_{REF}$), make possible the determination of the differential turn-on resistance $R_{DIFF}$ off the transistor. Using the DC value of the drain-to-source voltage and the resistance $R_{DIFF}$ obtained, the load current can be calculated.

Thus, the invention is seen as a circuit arrangement for determining measurement quantities such as Z, U, I with any load arrangement using the source-to-drain path of a field effect transistor with linear resistance behavior in the conducting state. Such an arrangement comprises a device having a first connection between the load arrangement and the source or drain connection of the field effect transistor. Such an arrangement is also able to supply or draw off a measuring current differing from the load current in frequency and/or signal shape, and which further comprises a first measuring circuit having a second connection, for example, at the source or the drain electrode and a third connection, for example, at the drain or the source electrode. The measuring circuit responds only to voltage variations caused by the measuring current supplied or drawn off. A second measuring circuit measures the voltage drop caused by the load current at the circuit arrangement, for example, such that, with the measuring current of the device known at the first connection, the measuring voltage allows the first measuring circuit to precisely determine the impedance of the circuit arrangement together with the voltage measured by the second arrangement, making it possible to determine the current through the switch arrangement at any load. According to the invention, a measuring signal (measuring current) is superimposed on the load current to gather information on the actual turn-on resistance of the transistor to be monitored. The linear resistance behavior of the transistor is useful in this respect. The transistor serves as a kind of shunt resistor so that, according to the invention, a separate shunt or measuring resistor is not required.

Figure 3:
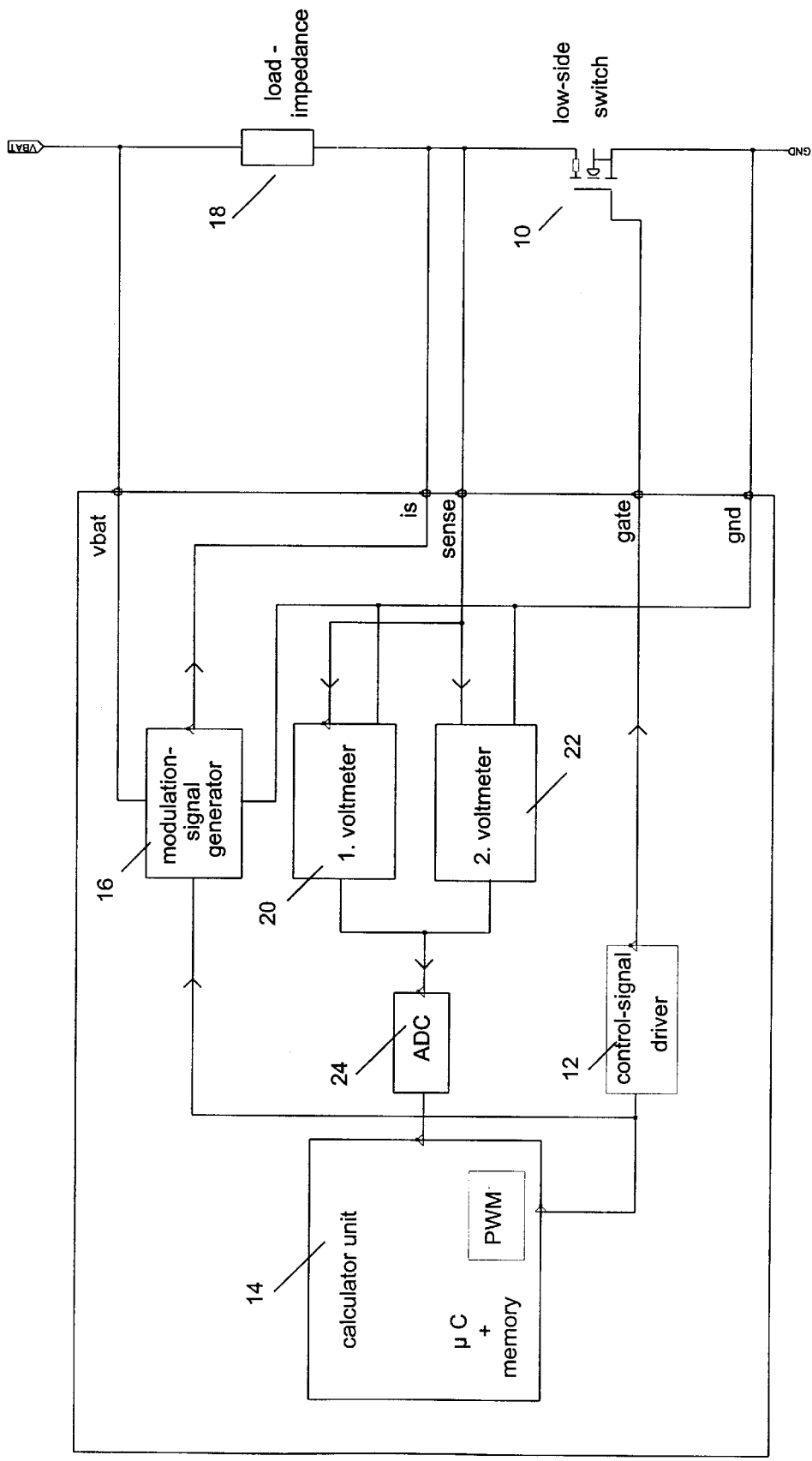
FIGS. 3 and 4 illustrate embodiments of the invented circuit arrangement implemented as electronic switches acting as high side and low side switches.
Figure 4:
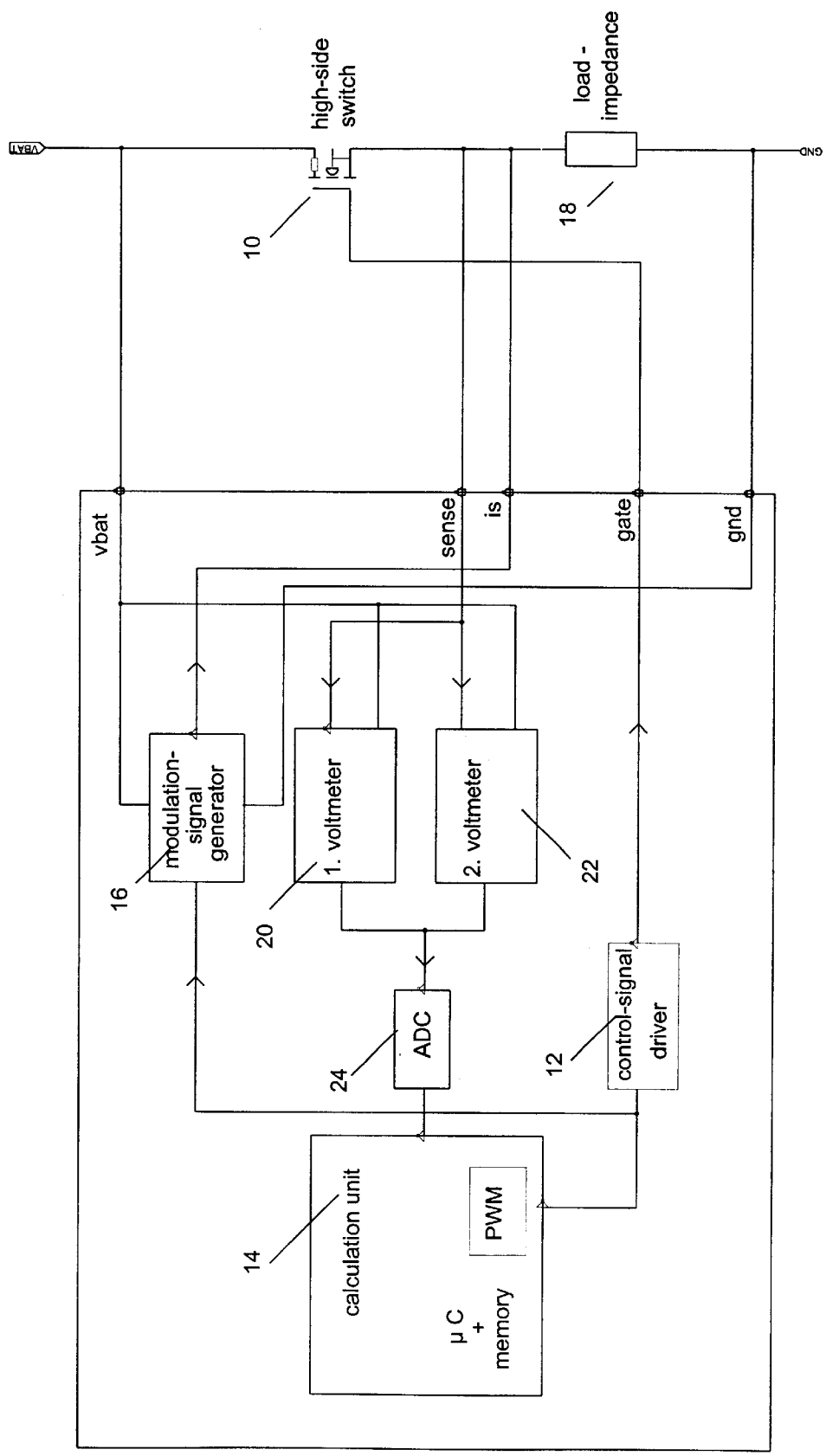

FIGS. 3 and 4 illustrate the use of the present circuit arrangement for monitoring and controlling a MOSFET used as a low side or high side switch. In this embodiment, the modulation signal is a measuring current superimposed on the load current.

The MOSFET 10 is driven by a control signal driver 12 which is in turn driven by an evaluation unit 14 embodied by a micro-controller. This evaluation unit 14 also drives a measuring signal generator 16 that generates an AC measuring current and supplies the same into the node between the MOSFET 10 and the load 18. The voltage drop across the MOSFET 10 is provided to a first voltage measuring device 20 and a second voltage measuring device 22. The first voltage measuring device 20 calculates that portion of the voltage drop that is due to the measuring current, whereas the second voltage measuring device 22 calculates the voltage drop across the MOSFET 10 due to the load current. The output signals from both voltage measuring devices are supplied to the evaluation unit 14 via an AD converter 24, which unit, as described above and if desired, calculates the differential turn-on resistance of the MOSFET 10 from the value of the measuring current and the output signal from the voltage measuring device 20, or directly determines the actual load current according to Ohm's law from the value of the measuring current and the output signals from the voltage measuring devices 20, 22. Moreover, the evaluation unit 14 can also determine the actual temperature of the MOSFET 10 from the actual turn-on resistance which, due to a previous calibration, is a measure of the temperature of the MOSFET 10.

Figure 7:
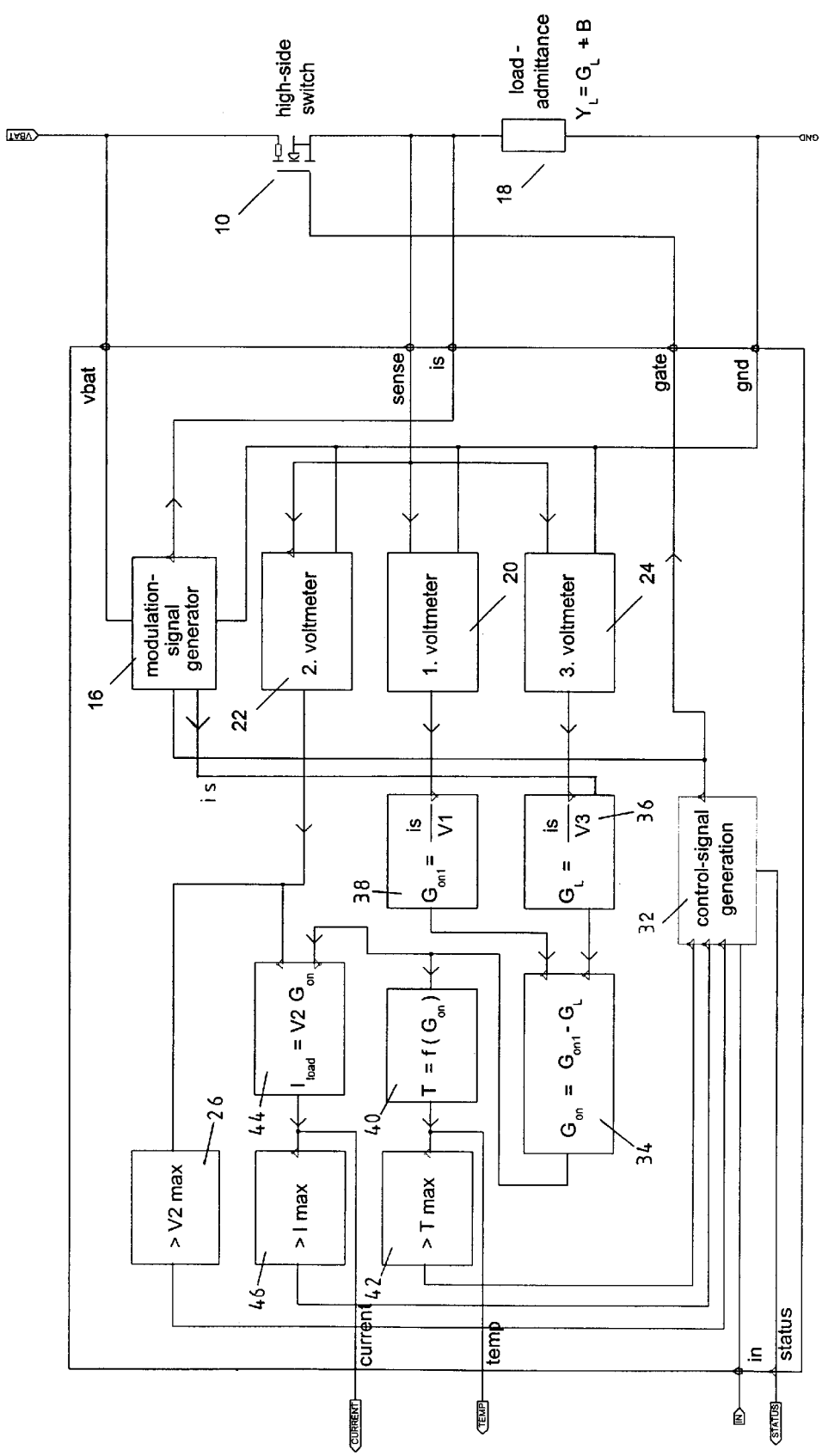
FIG. 7 illustrates embodiments of the invented circuit arrangement implemented for monitoring and controlling switches and loads comprising a load impedance correction algorithm to achieve higher accuracies.

The above description of FIGS. 3 and 4 assumes that the impedance of the MOSFET 10 in the turn-on state is negligible with regard to the impedance of the load 18. If this is not true, the calculations in the evaluation unit 14 have to be based on the portion of the measuring current flowing across the MOSFET 10, gained from the relation of the impedances. A typical embodiment is shown in FIG. 7 and will be described later.

As described above, the modulation signal generator may be a sine-wave source continuously or intermittently generating the modulation signal and supplying it to the circuit. Since the load current is modulated, the first voltage measuring device eventually is a demodulator that, by demodulating its input value, actually measures the voltage drop across the load caused by the modulation. The modulation signal generator and the demodulator of the first voltage measuring device are advantageously synchronous with each other. While the sine-wave source is used in particular to generate a continuous modulation signal, its time-discrete modulation signal may be generated using a pulse source as the modulation signal generator. In this case again, the first voltage measuring device is a demodulator, the pulse source and the demodulator are advantageously synchronous with each other.

The circuitry of the modulation signal generator may be realized, for example, such that a current source is connected in parallel to the load. With such a circuit arrangement, the dynamics of the modulation signal is independent of the value of the load current. If, however, the modulation signal generator is provided with a controllable resistor arranged in parallel to the electronic switch, the dynamics of the modulation signal depends linearly on the load current, but the modulation has lower power dissipation. It is true for all cases described that the modulation/demodulation of the load current may be effected either continuously or discretely with respect to time. This depends solely on the concrete application.

Figure 5:
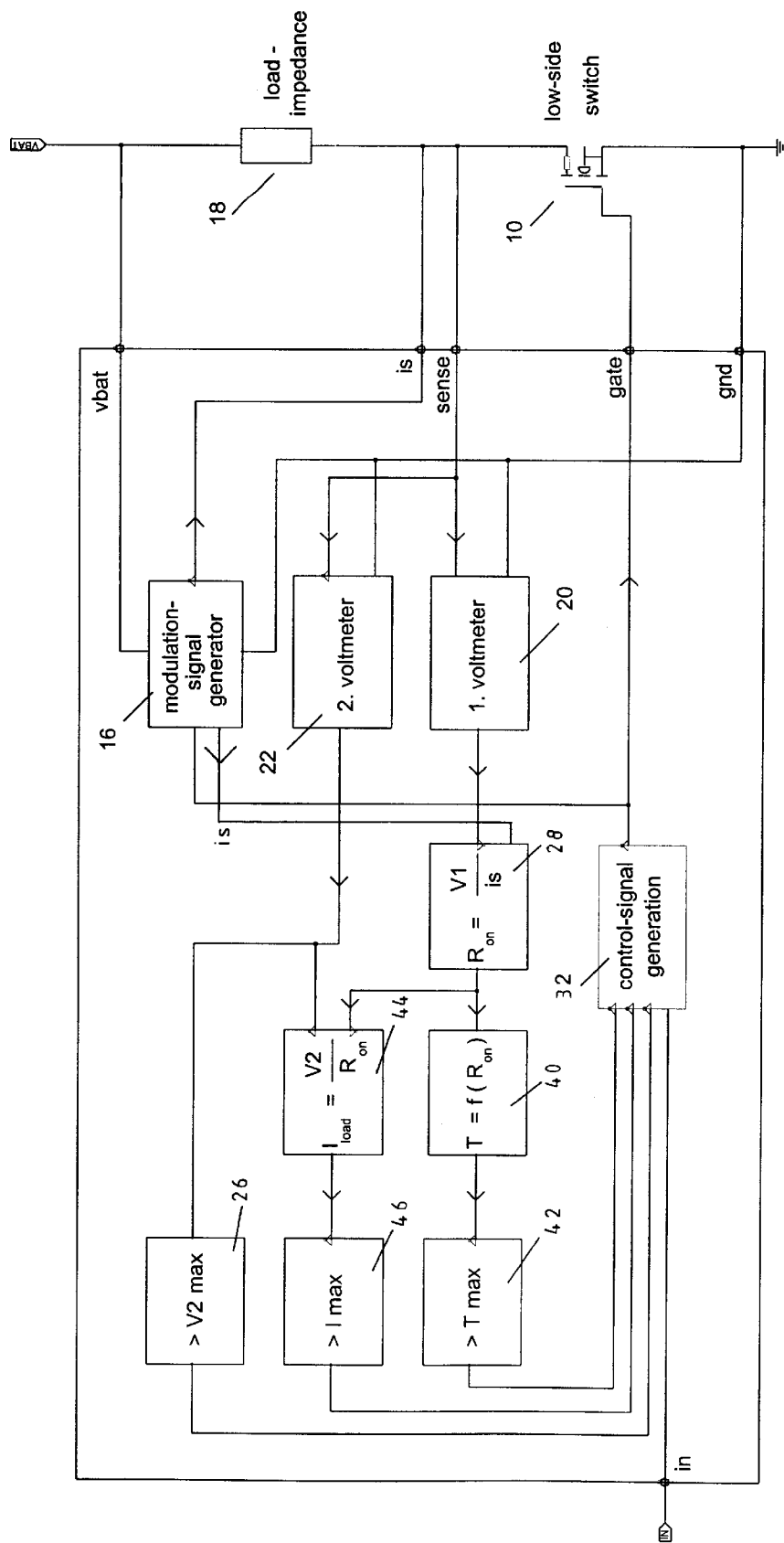
FIGS. 5 and 6 illustrate embodiments of the invented circuit arrangement according to FIGS. 3 and 4, comprising an analogue evaluation unit instead of a micro-controller.

Regarding the evaluation unit, the embodiments of the invention described employ microprocessors, i.e. digital circuits. However, it is also possible to implement the evaluation unit as an analog circuit, as shown in FIGS. 4 and 5. Advantages regarding space requirements may be expected from such an analog circuit. The evaluation is either done based on the momentary values of the two voltage drops and the modulation signal and/or the amplitude of the modulation signal or the voltage drops, respectively. When the measuring extends over several cycles, the load current can be determined as the average value of the load current determined per cycle.

Figure 6:
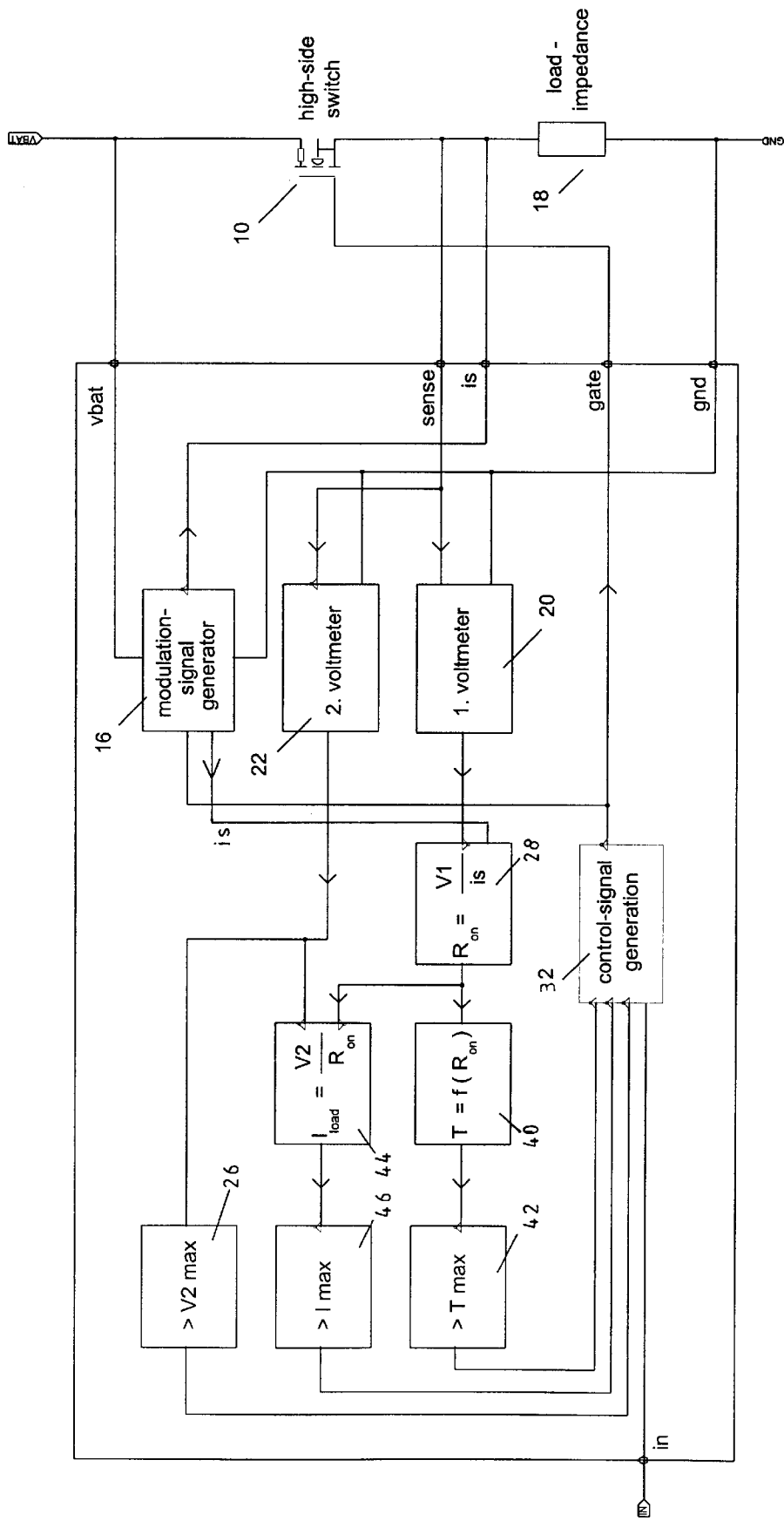

FIGS. 5 and 6 illustrate the use of the invented circuit arrangement for monitoring and controlling an electronic switch 10 used in low or high side configuration with a load 18. In contrast to FIGS. 3 and 4, the digital evaluation unit 14 is replaced by a set of analogue evaluation units 26 to 46. Furthermore the electronic switch 10 is driven by a control signal generator unit 32 replacing the control signal driver 12. Unit 32 is controlling the electronic switch 10 and all monitoring and evaluating units of the arrangement in accordance with external steering signals, for example a pulse width modulated signal, supplied at input "in" and overriding control signals supplied from the internal threshold detection units 26, 42 and 46.

Monitoring of the electronic switch is performed in FIGS. 3 and 4 using modulation signal generator 16, first voltage measuring device 20, and second voltage measuring device 22. Unit 28 delivers the analogue representation of the differential turn-on impedance of the electronic switch 10 resulting from dividing the output of voltage measuring device 20 by the value of the measuring current "is" supplied by the modulation signal generator 16. Unit 40 determines the actual impedance change of electronic switch 10 versus a reference value, which for example has been defined during a previous calibration, or any other well defined measurement set-up. In turn, the output of unit 40 is a measure of the temperature of the electronic switch 10. This output is compared with predefined temperature time curves in threshold detection unit 42. In case of a overheat condition, a overheat flag is sent to control signal generation unit 32.

The output of the second voltage measuring device 22, representing the voltage drop across the electronic switch 10 due to the load current, is compared with predefined voltage time curves in the threshold detection unit 26. In case of a critical voltage condition, an overvoltage flag is sent to control signal generation unit 32. Furthermore, the output of voltage measuring device 22 is divided by the output of unit 28, the differential turn-on impedance, in unit 44 representing Ohm's law. The output of unit 44, the current through the electronic switch 10, is compared to predefined current time curves in the current threshold detector. In case of a critical current condition, a current flag is sent to control signal generation unit 32.Signal generation unit 32 is driving the electronic switch 10 in accordance with the external steering signal and additionally protecting it against observed critical operating conditions, measured and evaluated as described above. In case of a critical operating condition, the electronic switch is driven into a safe operating point, for example turned-off for a given delay time. Due to the direct measurement approach of the invented circuit arrangement, parameter changes of the electronic switch 10 can be taken into account or compensated in the evaluation units.

FIG. 7 illustrates the use of the invented circuit arrangement for monitoring and controlling an electronic switch 10 used, for example in high side configuration like in FIG. 6, with a third voltage measuring device 24 for impedance correction, and for performing differential admittance measurements of the load 18 using modulated signal "is" supplied by the modulation signal generator 16 for example during turn-off periods of the electronic switch. Additional impedance correction is performed according to Ohm's law in unit 34 using uncompensated differential admittances $G_{on1}$ of unit 38 and $G_L$ of unit 36 in configurations where the turn-on impedance of the electronic switch 10 compared with the impedance of the load 18 cannot be neglected. The compensated admittance is evaluated by units 40 and 42 for switch temperature and by units 44 and 46 for switch 10 current as described for FIG. 6. For advanced control concepts, the analogue signal "current" supplied from unit 44 and the analogue signal "temp" supplied from unit 40 are made available for external observations, for example during calibration. Furthermore a digital status information is supplied from control signal generation unit 32, which can be useful for external error handling at the system level.

What is claimed is:

1. A circuit arrangement for monitoring and controlling an electronic switch provided for controlling a load and load current flowing through the load during turn-on intervals and for driving the load, the switch having a substantially linear resistance behavior during parts of its turn-on state and the operating point of the switch being located in this part of the turn-on state during the load control, the circuit arrangement comprising:

a modulation signal generator for generating a modulation signal modulating the load current flowing through the electronic switch, the electronic switch being driven by a control signal driver;

a first voltage measuring device for measuring a first voltage drop across the electronic switch caused by the modulation signal;

a second voltage measuring device for measuring a second voltage drop across the electronic switch caused by the load current, the first and second voltage drops being supplied to an analog-to-digital converter for calculating an output signal based on the first and second voltage drops; and an evaluation unit for determining the load current from the modulation signal and the output signal of the analog-to-digital converter.

2. The circuit arrangement of claim 1, wherein the evaluation unit determines the turn-on resistance of the electronic switch from the modulation signal and the first voltage drop.

3. The circuit arrangement of claim 2, wherein the evaluation unit determines the temperature of the electronic switch from the turn-on resistance of the switch as determined.

4. The circuit arrangement of claim 1, wherein the electronic switch is a field effect transistor, in particular a MOSFET.

5. The circuit arrangement of claim 1, wherein, when the impedance of the electronic switch at the operating point is negligible with respect to the impedance of the load, the evaluation unit determines the load current and/or the turn-on resistance of the electronic switch from the modulation signal generated by the modulation signal generator.

6. The circuit arrangement of claim 1, wherein, when the impedance of the electronics switch at the operating point is known and is not negligible with respect to the load of the impedance, the evaluation unit determines the load current and the turn-on resistance of the electronic switch from the modulation signal as corrected by the impedance of the load.

7. The circuit arrangement of claim 1, wherein, outside a turn-on interval of the switch, the evaluation unit determines the impedance of the load from the first and second voltage drops and the modulation signal if the impedance of the load is unknown, but the impedance of the electronic switch at the operating point of the load is negligible with respect to the impedance of the load and the impedance of the load has an approximately linear behavior, in particular an approximately constant behavior.

8. The circuit arrangement of claim 7, wherein the electronic switch is a field effect transistor, in particular a MOSFET.

9. The circuit arrangement of claim 7, wherein, when the impedance of the electronic switch at the operating point is negligible with respect to the impedance of the load, the evaluation unit determines the load current and/or the turn-on resistance of the electronic switch from the modulation signal generated by the modulation signal generator.

10. The circuit arrangement of claim 7, wherein, when the impedance of the electronic switch at the operating point is known and is not negligible with respect to the load of the impedance, the evaluation unit determines the load current and the turn-on resistance of the electronic switch from the modulation signal as corrected by the impedance of the load.

11. The circuit arrangement of claim 2, wherein the electronic switch is a field transistor, in particular a MOSFET.

12. The circuit arrangement of claim 3, wherein the electronic switch is a field transistor, in particular a MOSFET.

13. The circuit arrangement of claim 2, wherein, when the impedance of the electronic switch at the operating point is negligible with respect to the impedance of the load, the evaluation unit determines the load current and/or the turn-on resistance of the electronic switch from the modulation signal generated by the modulation signal generator.

14. The circuit arrangement of claim 3, wherein, when the impedance of the electronic switch at the operating point is negligible with respect to the impedance of the load, the evaluation unit determines the load current and/or the turn-on resistance of the electronic switch from the modulation signal generated by the modulation signal generator.

15. The circuit arrangement of claim 2, wherein, when the impedance of the electronic switch at the operating point is known and is not negligible with respect to the load of the impedance, the evaluation unit determines the load current and the turn-on resistance of the electronic switch from the modulation signal as corrected by the impedance of the load.

16. The circuit arrangement of claim 3, wherein, when the impedance of the electronic switch at the operating point is known and is not negligible with respect to the load of the impedance, the evaluation unit determines the load current and the turn-on resistance of the electronic switch from the modulation signal as corrected by the impedance of the load.

17. The circuit arrangement of claim 2, wherein, outside a turn-on interval of the switch, the evaluation unit determines the impedance of the load from the first and second voltage drops and the modulation signal, if the impedance of the load is unknown but the impedance of the electronic switch at the operating point of the load is negligible with respect to the impedance of the load and the impedance of the load has an approximately linear, in particular an approximately constant behavior.

18. The circuit arrangement of claim 3, wherein, outside a turn-on interval of the switch, the evaluation unit determines the impedance of the load from the firs and second voltage drops and the modulation signal, if the impedance of the load is unknown but the impedance of the electronic switch at the operating point of the load is negligible with respect to the impedance of the load and the impedance of the load has an approximately linear, in particular an approximately constant behavior.

* * * * *